(12) United States Patent
Onozawa

(10) Patent No.: US 7,436,273 B2
(45) Date of Patent: Oct. 14, 2008

(54) SURFACE ACOUSTIC WAVE DEVICE AND METHOD FOR MANUFACTURING THE SAME

(75) Inventor: Yasuhide Onozawa, Kouza-gun (JP)

(73) Assignee: Epson Toyocom Corporation, Tokyo (JP)

( * ) Notice: Subject to any disclaimer, the term of this patent is extended or adjusted under 35 U.S.C. 154(b) by 111 days.

(21) Appl. No.: 11/217,556

(22) Filed: Sep. 1, 2005

(65) Prior Publication Data

US 2006/0049896 A1 Mar. 9, 2006

(30) Foreign Application Priority Data

Sep. 9, 2004 (JP) ............................. 2004-263026

(51) Int. Cl.
*H03H 9/64* (2006.01)
(52) U.S. Cl. ..................... 333/193; 333/133; 333/194; 333/195; 333/196; 310/313 R; 310/313 B; 310/313 C; 310/313 D; 438/106; 438/108; 29/25.35
(58) Field of Classification Search ................ 333/133, 333/193–196; 310/313 R, 313 B, 313 C, 310/313 D; 438/106–132; 29/25.35
See application file for complete search history.

(56) References Cited

U.S. PATENT DOCUMENTS

| | | | |
|---|---|---|---|
| 6,713,940 B2 * | 3/2004 | Takamine | 310/313 R |
| 6,744,333 B2 * | 6/2004 | Sawada | 333/133 |
| 7,227,429 B2 * | 6/2007 | Kawachi et al. | 333/133 |
| 2003/0090338 A1 * | 5/2003 | Muramatsu | 333/133 |
| 2004/0196119 A1 * | 10/2004 | Shibahara et al. | 333/193 |
| 2005/0151602 A1 * | 7/2005 | Hattanda et al. | 333/193 |
| 2005/0264375 A1 * | 12/2005 | Ikuta et al. | 333/133 |
| 2005/0285699 A1 * | 12/2005 | Yokota et al. | 333/133 |

FOREIGN PATENT DOCUMENTS

JP 2002-208832 7/2002

* cited by examiner

*Primary Examiner*—Carl Whitehead, Jr.
*Assistant Examiner*—Maliheh Malek
(74) *Attorney, Agent, or Firm*—William L. Androla; H. Henry Koda

(57) ABSTRACT

A SAW chip (11) where ones are balanced signal terminals and the others are unbalanced signal terminals is mounted on a mounting board (12) in a flip chip manner, and the mounting board (12) and a surface of the SAW chip are covered with resin (19). At that time, grounds of first and second SAW filters (1, 2) in the SAW chip (11) are connected together and an annular pattern (14) is formed so as to surround a signal pattern of the SAW chip (11) on the mounting board (12) on which the SAW chip (11) is mounted, and the annular electrode (14) is connected to a ground pattern.

6 Claims, 7 Drawing Sheets

(a)

(b)

(a)

(b) Mounting face of Saw chip (c) Inner layer face (d) Outer terminal face (a)

880MHz

A : Present embodiment
B : Conventional example (b)

2140MHz

A : Present embodiment
B : Conventional example (a)

(b)

PRIOR ART

SURFACE ACOUSTIC WAVE DEVICE AND METHOD FOR MANUFACTURING THE SAME

BACKGROUND OF THE INVENTION

1. Field of the Invention

The present invention relates to a surface acoustic wave (hereinafter, SAW) device and a method for manufacturing the same, and is particularly suitable for a SAW device where a plurality of SAW filters are accommodated in one package.

2. Description of the Related Art

In recent years, wide band filters are demanded in a mobile communication device of a multi-band correspondence type having two or more communication systems. However, it is difficult to realize a broadband filter with low loss, while covering two or more bands. Therefore, a SAW device constituted to accommodate a plurality of SAW filters in one package having a lid member for shielding has been widely used.

For example, Japanese Patent Application Laid-open (JP-A) No. 2002-208832 discloses an SAW device where a plurality of SAW filters are accommodated in one package, mutual interference between SAW filters can be reduced, and an attenuation amount outside a passing band can be increased.

A conventional SAW device described in JP-A No. 2002-208832 will be explained with reference to FIGS. 10 and 11.

FIG. 10 is a diagram showing a schematic constitution of the conventional SAW device shown in JP-A No. 2002-208832. In the conventional SAW device, a first SAW filter 51 and a second SAW filter 52 are accommodated in one package 53. The first SAW filter 51 has an unbalanced input signal terminal 54, a ground terminal 55, and balanced output signal terminals 56, 57, while the second SAW filter 52 has an unbalanced input signal terminal 58, a ground terminal 59, and balanced output signal terminals 60, 61.

FIG. 11 is a diagram showing a schematic structure of the SAW device shown in FIG. 10. In an SAW chip 62, the first SAW filter 51 and the second SAW filter 52 shown in FIG. 10 are formed on a surface of a piezoelectric substrate. Such an SAW chip 62 is then accommodated inside the package 53 by a face down process such that a face of the SAW chip 62 on which electrodes are formed is directed downwardly. The package 53 has a base board 53a and an annular side wall 53b fixed on the base board 53a. An upper opening of the annular side wall 53b is then sealed by a lid member 53c for shielding. Furthermore, an electrode land 53d is formed on the base board 53a. The electrodes of the SAW chip 62 are joined to the electrode land 53d via bumps 63 so that the SAW chip 62 and the package 53 are mechanically connected to each other and the electrodes of the SAW chip 62 and the electrode land 53d of the package 53 are electrically connected to each other.

Recently, along with the downsizing of mobile communication devices, such as a portable or cellar phone, demands for downsizing and thinning quartz-related parts used in these mobile communication devices are increasing. As shown in FIG. 11, however, since such a conventional SAW device as described above has a structure where the SAW chip 62 is bonded within the package 53 in a flip-chip manner, it is difficult to achieve further downsizing. In case of structure where the SAW chip 62 is accommodated within package 53, this is because it is necessary to make the size of the SAW device larger than an actual size of the SAW chip 62 by a size corresponding to two times a thickness d1 of each side walls 53b formed on both sides of the package 53 and two times a gap d2 between the sidewall 53b and the SAW chip 62, it is also difficult to thin the thickness d1 of the side wall 53b in view of a strength, and the gap d2 cannot be reduced from the aspect of manufacture.

That is, although the conventional SAW device is excellent in attenuation characteristics outside a passing band, downsizing cannot be achieved.

The present invention has been achieved in view of the above circumstances and an object thereof is to provide a SAW device where downsizing can be achieved without deteriorating attenuation characteristics outside a passing band, and a method for manufacturing the same.

SUMMARY OF THE INVENTION

In order to achieve the above object, according to a first aspect of the present invention, there is provided a SAW device comprising: a SAW chip including a plurality of SAW filters with different central frequencies formed on one piezoelectric substrate, ones of input and output terminals of said plurality of SAW filters being constituted as balanced signal terminals and the others thereof being constituted of unbalanced signal terminals; a mounting board on which said SAW chip is mounted on a connection electrodes via conductive bumps in a flip chip manner; and a resin layer which is formed so as to cover the mounting board and a surface of the SAW chip, wherein respective grounds of said plurality of SAW filters are connected together to be connected to one grounding pattern of said mounting board.

According to a second aspect of the invention, there is provided a SAW device where an annular electrode is formed on a mounting face of said mounting board on which the SAW chip is mounted so as to surround a signal pattern of said SAW chip and said annular electrode is connected to a ground.

According to a third aspect of the invention, there is provided a SAW device where said annular electrode is connected to the ground via an inner layer wiring of said mounting board or a pattern formed on the mounting face.

According to a fourth aspect of the invention, there is provided a SAW device where the electrodes of said SAW chip and the connection electrodes on the mounting face of said mounting board connected via said bumps are separated by the grounding pattern for each of the SAW filters respectively provided on the SAW chip.

According to a fifth aspect of the invention, there is provided a SAW device where metal films are formed on an upper face and side faces of said SAW chip and a portion of the mounting board.

According to a sixth aspect of the invention, there is provided a SAW device where said annular electrode is formed of a metal film.

According to a seventh aspect of the invention, there is provided a method for manufacturing a SAW device comprising a step of mounting a SAW chip including a plurality of SAW filters with different central frequencies formed on one piezoelectric substrate, ones of input and output terminals of said plurality of SAW filters being constituted as balanced signal terminals and the others thereof being constituted as unbalanced signal terminals, on connection electrodes of a mounting board via conductive bumps in a flip chip manner; and a step of, after mounting said SAW chip on said mounting board, forming an annular electrode on said mounting board by forming a metal film.

DETAILED DESCRIPTION OF THE PREFERRED EMBODIMENTS

Exemplary embodiments of the present invention will be explained with reference to the accompanying drawings.

Figure 1:
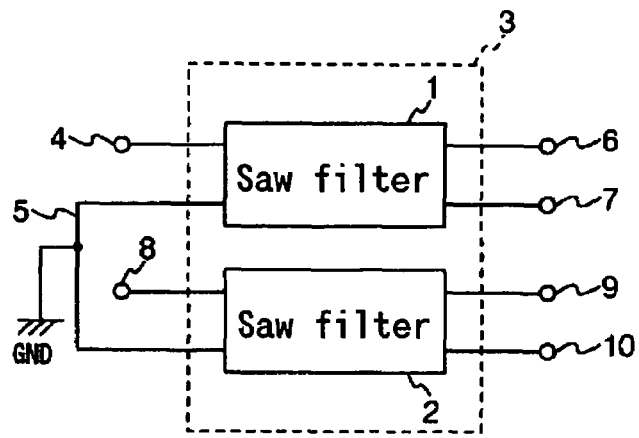
FIG. 1 is a diagram showing a schematic configuration of an SAW device according to an embodiment of the present invention.

FIG. 1 is a diagram showing a schematic configuration of a SAW device according to an embodiment of the present invention.

Figure 10:
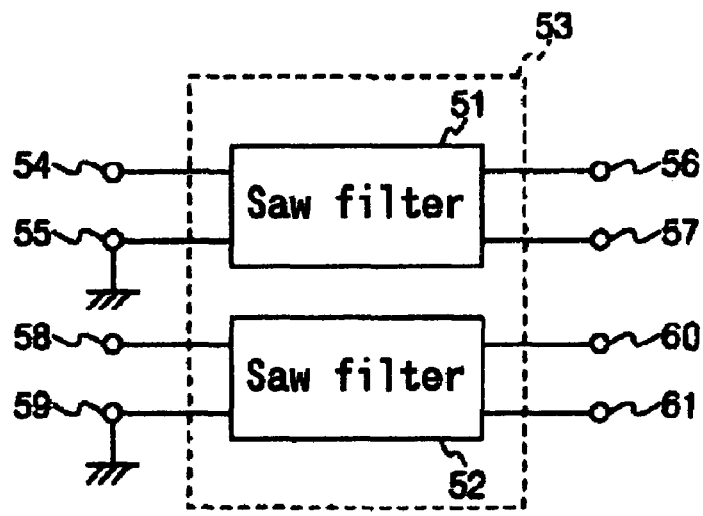
FIG. 10 is a diagram showing a schematic configuration of a conventional SAW device.

A SAW device shown in FIG. 1 is a so-called "dual SAW filter" where a first SAW filter 1 and a second SAW filter 2 are accommodated in one package 3. In this case, a central frequency of the first SAW filter 1 is set to 880 MHz and a central frequency of the second SAW filter 2 is set to 2140 MHz. The first SAW filter 1 has an unbalanced input signal terminal 4, a ground terminal 5, and balanced output signal terminals 6, 7, while the second SAW filter 2 has an unbalanced input signal terminal 8, another ground terminal 5, and balanced output signal terminals 9, 10. In the SAW device of the embodiment, the ground terminals 5 of the first and the second SAW filters 1, 2 are connected together. That is, the conventional SAW device is different from the SAW device of the embodiment in a point that grounds (GRDs) are electrically separated from each other in the conventional first and second SAW filters 51, 52 shown in FIG. 10, but the grounds (GNDS) of the first and the second SAW filters 1, 2 are connected together in the SAW device of the embodiment shown in FIG. 1.

FIGS. 2(a) and 2(b) show a schematic constitution of the SAW device of the embodiment. FIG. 2(a) is an exploded perspective view of the SAW device, and FIG. 2(b) is a sectional view of the SAW device taken along line A-A shown in FIG. 2(a).

In FIGS. 2(a) and 2(b), a SAW chip 11 is formed from a piezoelectric substrate. Though not shown, interdigital electrodes (IDTs) forming the first and the second SAW filters 1, 2 are formed on a surface of the substrate. For example, LiTaO3 is used as material for the piezoelectric substrate of the SAW chip 11.

A mounting board 12 serving as a base is formed of an alumina board having, for example, a three-layered structure, and a plurality of connection electrodes 13 and an annular electrode 14 are formed on a mounting face on which the SAW chip is mounted. Furthermore, inner layer electrodes 16 are formed on an inner layer face of the alumina substrate and outer electrodes 15 are formed on an outside electrode face. These mounting face, inner layer face, and outer electrode face are connected to one another through via holes.

In the SAW device of the embodiment, the SAW chip 11 is mounted to the mounting face of the mounting board 12 in a flip chip manner by connecting bonding pads 17 of the SAW chip 11 and the connection electrodes 13 on the mounting board 12 via connection members such as bumps 18 in such a state that a face of the SAW chip 11 on which the electrodes are formed is directed downwardly.

An example of a connection configuration between the bumps 18 provided on the SAW chip 11 and the mounting board 12 is shown with reference to FIGS. 3(a) to 3(d).

Figure 3:
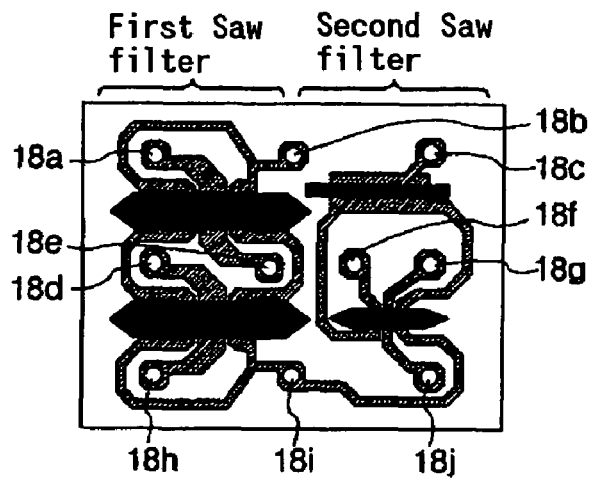
FIGS. 3(a) to 3(d) show one example of a connection configuration between bumps provided on a SAW chip and a mounting board.
Figure 3:
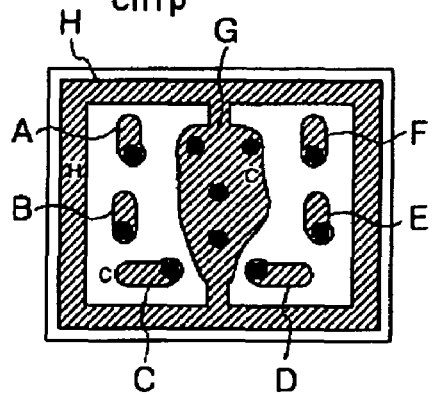
Figure 3:
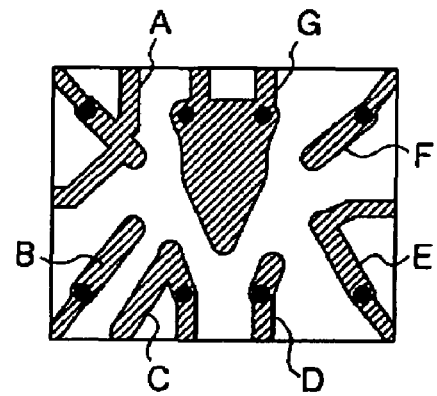
Figure 3:
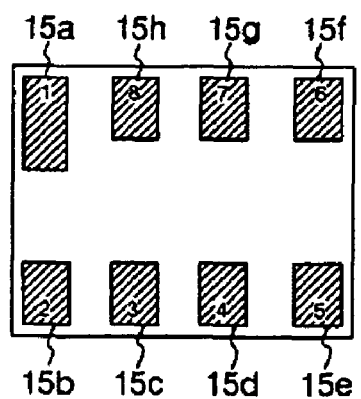

FIG. 3(a) is a perspective view of an arrangement example of bumps provided on the SAW chip 11. Furthermore, FIG. 3(b) is a perspective view of a wiring pattern on the mounting face of the mounting board 12, FIG. 3(c) is a perspective view of a wiring pattern on the inner layer face of the mounting board 12, and FIG. 3(d) is a perspective view of a wiring pattern on the outer terminal face of the mounting board 12. FIGS. 3(a) to 3(d) are perspective views from an upper face side.

In this case, wiring routes from input and output terminals of the first and the second SAW filters 1, 2 formed in the SAW chip 11 to the outer electrodes 15 of the mounting board 12 are as follows:

First SAW Filter 1

Unbalanced input signal terminal 4: bump 18a—wiring pattern A—external electrode 15a Balanced output signal terminal 6: bump 18d—wiring pattern B—external electrode 15b Balanced output signal terminal 7: bump 18h—wiring pattern C—external electrode 15c Second SAW filter 2

Unbalanced input signal terminal 8: bump 18c—wiring pattern F—external electrode 15f Balanced output signal terminal 9: bump 18g—wiring pattern E—external electrode 15e Balanced output signal terminal 10: bump 18j—wiring pattern D—external electrode 15d Ground terminals 5: bumps 18b, 18e, 18f, 18i—wiring patterns G, H—external terminals 15g, 15h.

Referring back to FIGS. 2(a) and 2(b), the annular electrode 14 on the mounting board 12 shown in FIG. 12 is formed so as to surround wiring patterns of the first and the second SAW filters 1, 2 formed on the surface of the mounting board 12, for example. Furthermore, the annular electrode 14 is connected to a ground line via the inner wiring 16 of the mounting board 12. The annular electrode 14 is not required to be connected to the ground line via the inner wiring 16 of the mounting board 12 necessarily, and it may be connected to the ground line via wiring formed on the mounting face of the mounting board 12. A surface of the SAW chip 11 mounted to such amounting board 12 is then covered with epoxy-base resin 19.

Furthermore, in the embodiment, metal such as aluminum (Al) is formed from above the SAW chip 11 by vapor deposition, sputtering process, or the like in a state that the SAW chip 11 has been mounted on the mounting board 12 in a flip chip manner. Thereby, metal film 20 with a thickness of, for example, 0.3 micrometer (μm) or so are formed on an upper face and side faces of the SAW chip 11, and a portion of the mounting board 12.

Figure 11:
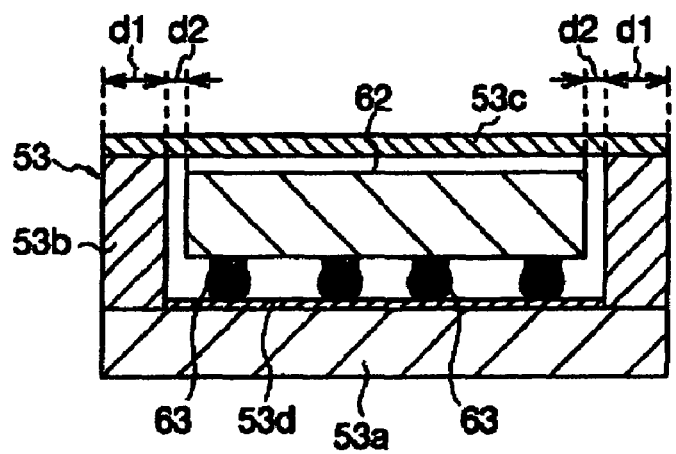
FIG. 11 is a diagram showing a schematic configuration of another conventional SAW device.

In the SAW device of the embodiment thus constituted, after the SAW chip 11 is mounted on the mounting board 12 in a flip chip manner, a surface of the SAW chip 11 is sealed air-tightly by resin 19, so that the annular side wall of the conventional package shown in FIG. 11 is made unnecessary. Therefore, downsizing of an SAW device conventionally set to a size of, for example, 3.0 mm×2.5 mm, to a size of 2.0 mm×1.6 mm can be realized.

Furthermore, in the SAW device of the embodiment, the ground terminals 5 of the first and the second SAW filters 1, 2 provided in the SAW chip 11 are connected together on the mounting board 12 and the annular electrode 14 is formed so as to surround the wiring pattern of the SAW chip 11 formed on the mounting board 12, and the annular electrode 14 is connected to a ground. As a result, even if a lid body for shielding conventionally required is not used, attenuation characteristics outside a passing band can be prevented from deteriorating in the SAW device according to the embodiment.

Furthermore, by sharing the ground pattern of the mounting board 12 in the first and the second SAW filters 1, 2, the flexibility of the wiring on the side of the mounting board 12 is improved, so that improvement of electric characteristics based upon a wiring design of the mounting board 12 on further small-sizing can be achieved.

Furthermore, in the SAW device of the embodiment, by forming the metal film 20 on the upper face and the side faces of the SAW chip 11, a volume resistivity value of a sealing structure body covering the SAW chip 11 is made smaller than that in case that a portion corresponding to a thickness of the metal film 20 is also formed from the sealing resin 19. Therefore, for example, when $LiTaO_3$ with strong pyroelectricity is used as the piezoelectric material for the SAW chip 11 and such a resin sealing structure that the $LiTaO_3$ and the sealing resin 19 come in direct contact with each other is realized, the sealing resin 19 is charged, when a temperature gradient is given the SAW chip 11, which results in adverse influence on electrical characteristics or the like, but in the embodiment, such a problem can be prevented.

Furthermore, when the metal film 20 is formed on a portion of an outer periphery of the mounting board 12 during formation of the metal film 20 on the upper face and the side faces of the SAW chip 11, a gap d10 between the mounting board 12 and a connection face of the SAW chip 11 is changed to a gap d11 reduced by a size corresponding to the thickness of the metal film 20 at a portion where the metal film 20 is formed. Therefore, there is such a merit that, for example, when the resin 19 is applied on the mounting board 12, the resin 19 can be prevented from flowing between the mounting board 12 and the SAW chip 11, so that degradation of performance due to inflow of the resin 19 can be prevented. When $LiTaO_3$ with increased conductivity is used in the SAW chip 11, charging does not occur in the sealing resin 19. In that case, it is not required to form the metal film 20 on the upper face and the side faces of the SAW chip 11 necessarily.

In the SAW device of the above-described embodiment, the case that the ground terminals 5 of the first and the second SAW filters 1, 2 are connected together and the annular electrode 14 is formed so as to surround the signal pattern of the SAW chip 11 on the mounting board 12, and the annular electrode 14 is connected to the ground has been explained as an example. However, the electrode 14 is not required to have a continuous annular shape but it may have a discontinuous structure if it satisfies requested specifications. For example, the electrode 14 may have an annular electrode partially disconnected practically, or it may be constituted by a plurality of grounding electrodes arranged so as to surround the mounting board 12.

Figure 4:
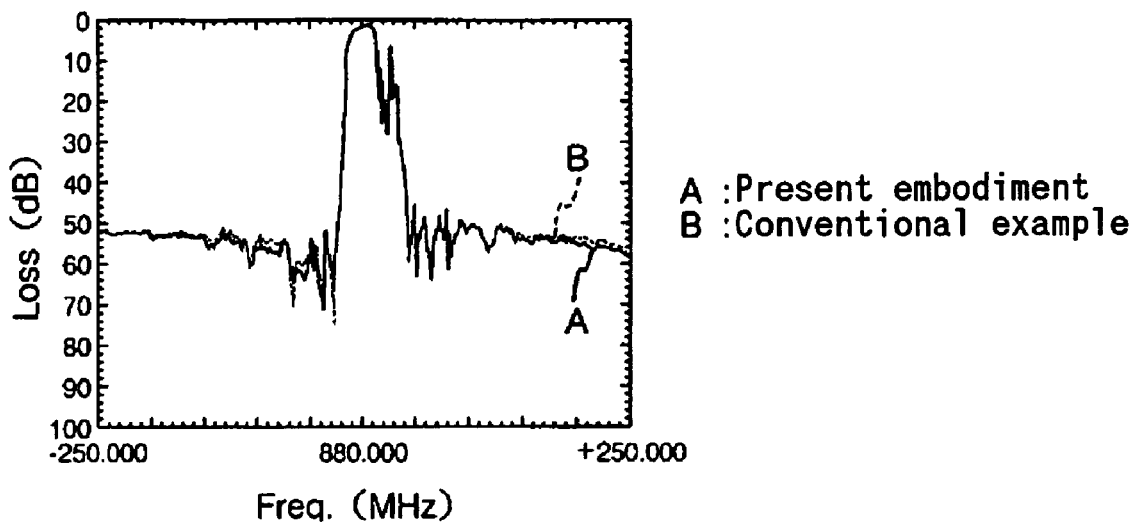
FIGS. 4(a) and 4(b) are graphs of frequency characteristics in the SAW device according to the embodiment.
Figure 4:
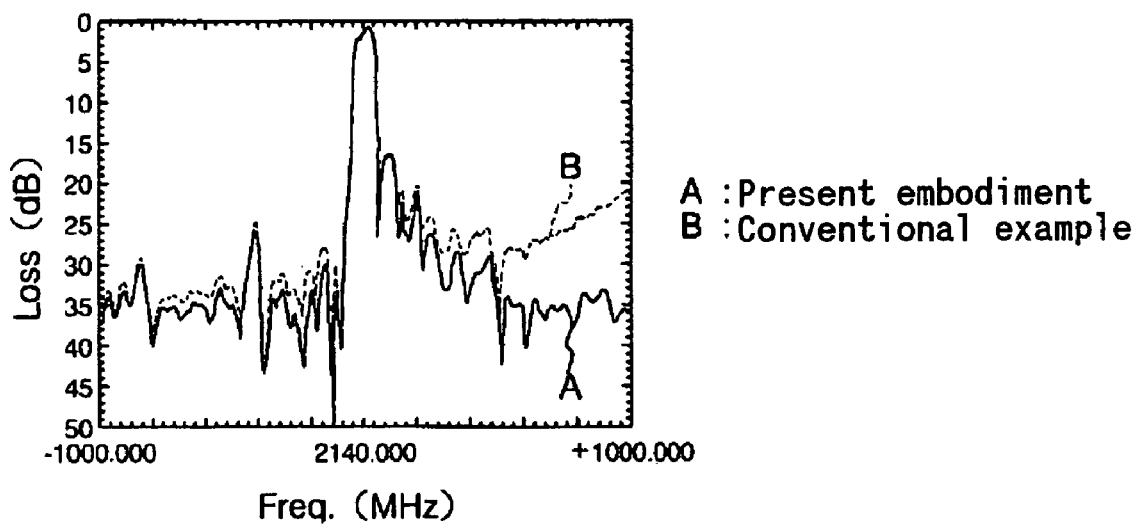

FIGS. 4(a) and 4(b) are graphs of frequency characteristics of the SAW device of the embodiment. A frequency characteristic of the first SAW filter 1 is shown in FIG. 4(a), and a frequency characteristic of the second SAW filter 2 is shown in FIG. 4(b). Frequencies of the conventional SAW device are also shown for comparisons in FIGS. 4(a) and 4(b).

As can be seen from FIG. 4(a), a frequency characteristic A of the first SAW filter 1 according to the embodiment has substantially the same as a frequency characteristic B of the conventional SAW filter and an attenuation amount of 50 dB or so can be obtained in bands except for a passing band (880 MHz). Thereby, it is understood that the first SAW filter 1 of the embodiment is a practically problem-free and excellent SAW filter (about 20 dB or less).

Furthermore, regarding a frequency characteristic A of the second SAW filter 2 according to the embodiment shown in FIG. 4(b), as can be seen from the comparison with a frequency characteristic B of the conventional SAW filter, an attenuation amount in the SAW filter 2 of the embodiment is larger than that in the conventional SAW filter except for a passing band (2140 MHz). It can be seen from the fact that the second SAW filter 2 of the embodiment is not only a practically problem-free filter but also has an attenuation characteristic more excellent than that in the conventional SAW filter in a higher frequency region.

Furthermore, as shown in FIG. 3(b), in the SAW device of the embodiment, a ground pattern G is formed between input/output patterns A, B, C of the first SAW filter 1 formed on the mounting face of the mounting board 12 on which the SAW chip 11 is mounted and input patterns D, E, F of the second SAW filter 2. Thereby, since electromagnetic interference between the first and the second SAW filters 1, 2 can be reduced, a SAW device with an excellent isolation characteristic can be realized.

Figure 5:
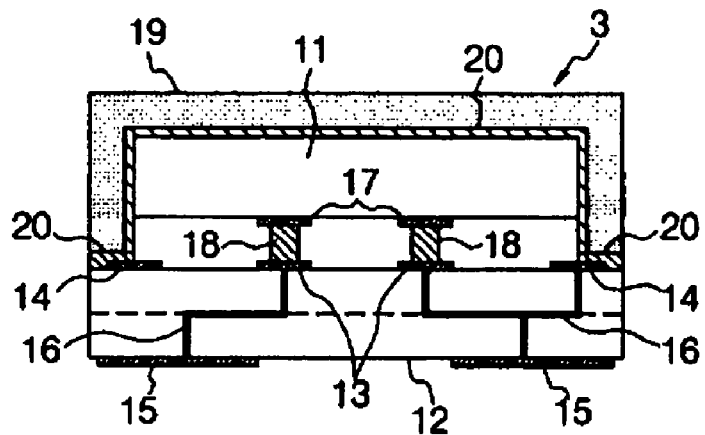
FIG. 5 shows a structure of a SAW device according to a second embodiment.

FIG. 5 shows a structure of a SAW device according to a second embodiment. Like parts shown in FIGS. 2(a) and 2(b) are denoted by like reference numerals, and detailed explanation thereof is omitted.

The SAW device shown in FIG. 5 is different from the SAW device shown in FIGS. 2(a) and 2(b) in a point that the metal film 20 formed on the surface of the SAW chip 11 is formed so as to seal an internal space between the SAW chip 11 and the mounting board 12.

As described above, in order to seal the internal space, the metal film 20 may be formed thicker. Furthermore, as a special method for forming the metal film 20 thicker, there is a method which performs vapor deposition from an obliquely up side of the SAW chip 11, as described in Japanese Patent Application No. 2004-142960. According to this method, since a sufficient amount of metal particles can be deposited between the SAW chip 11 and the mounting board 12, the metal films 20 formed on the side face of the SAW chip 11 and the upper face of the mounting board 12 can be formed to be thicker efficiently and the metal film 20 formed on the side face of the SAW chip 11 and the metal film 20 formed on the upper face of the mounting board 12 can be connected to each other reliably.

By employing such a constitution, moisture resistance of the SAW device can be improved considerably. At that time, since a structure for shielding the SAW chip 11 electromagnetically can be obtained by connecting the metal film 20 formed so as to seal the internal space to the annular electrode 14 formed on the mounting board 12 in electrically conductive manner, the attenuation characteristic of the SAW device can be further improved. Furthermore, balancing in the passing band can also be improved.

Figure 6:
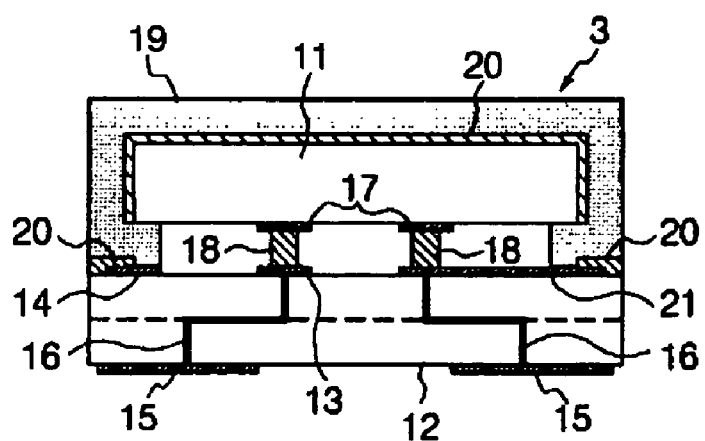
FIG. 6 shows a structure of a SAW device according to a third embodiment.

FIG. 6 shows a structure of a SAW device according to a third embodiment. Like parts as shown in FIG. 2 are denoted by like reference numerals, and detailed explanation thereof is omitted.

Figure 2:
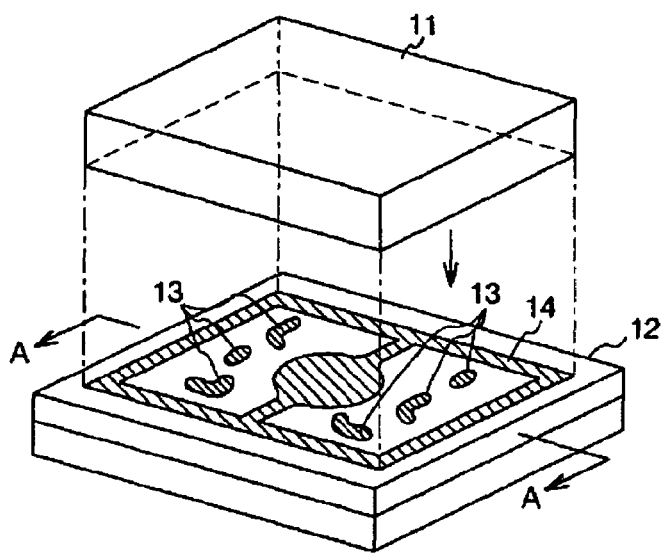
FIGS. 2(a) and 2(b) show a schematic structure of the SAW device according to the embodiment.
Figure 2:
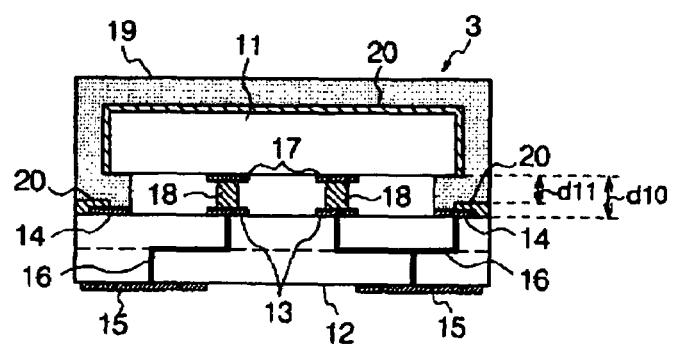

In the above-described SAW device shown in FIG. 2, the annular electrode 14 is connected to the ground pattern via the internal wiring 16 of the mounting board 12, but the SAW device shown in FIG. 6 is constituted such that the annular electrode 14 is connected to the ground pattern via a wiring pattern 21 formed on the mounting face of the mounting board 12.

Figure 7:
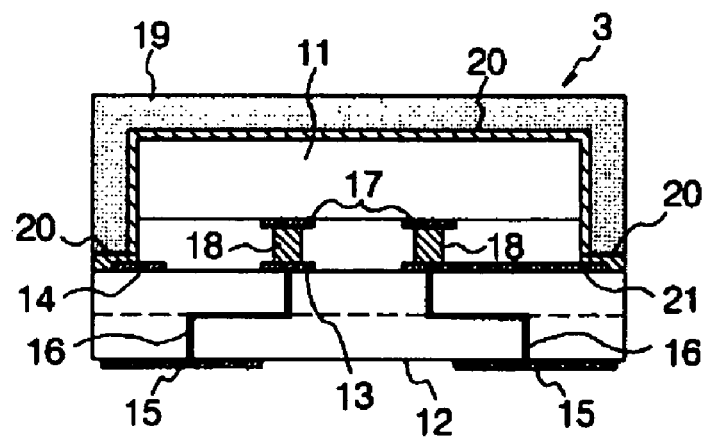
FIG. 7 shows a structure of a SAW device according to a fourth embodiment.

FIG. 7 shows a structure of a SAW device according to a fourth embodiment, which is constituted such that the metal film 20 formed on the surface of the SAW chip 11 is formed so as to seal the internal space between the SAW chip 11 and the mounting board 12 and the annular electrode 14 is connected to the ground pattern via the wiring pattern 21 formed on the mounting face of the mounting board 12.

Figure 8:
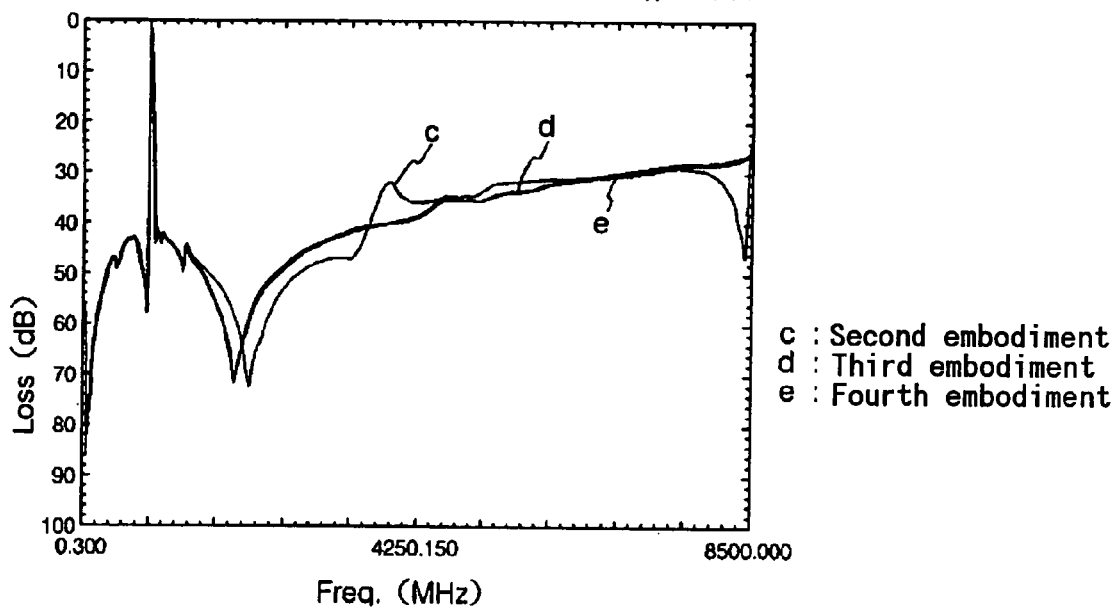
FIGS. 8(a) and 8(b) are graphs of frequency characteristics in the SAW devices shown in FIGS. 5 to 7.
Figure 8:
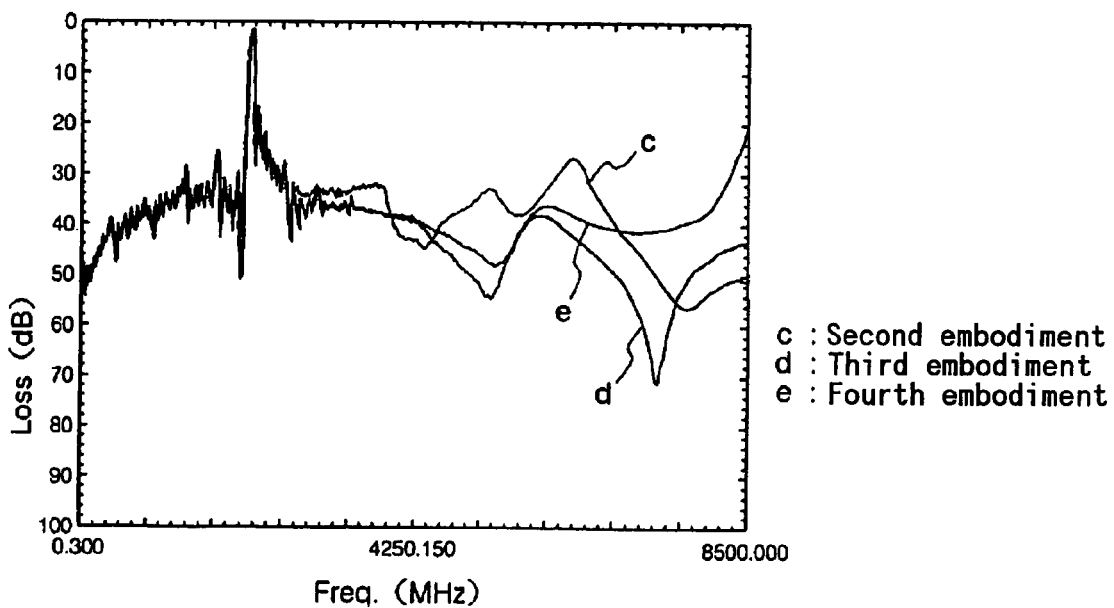

FIGS. 8(a) and 8(b) are graphs of frequency characteristics of the SAW devices according to the second to the fourth embodiments shown in FIGS. 5 to 7, frequency characteristics of the first SAW filters formed in the SAW chips being shown in FIG. 8(a) and frequency characteristics of the second SAW filters formed in the SAW chips being shown in FIG. 8(b). It can be seen from FIGS. 8(a) and 8(b) that the SAW devices according to the second to the fourth embodiments are practically problem-free and excellent SAW filters (about 20 dB or less), respectively.

Furthermore, in the SAW devices of the embodiments explained above, the annular electrode 14 is formed on the mounting board 12 in advance, but warpage of the mounting board 12 may occur due to the annular electrode 14 in this case. For example, when a wiring pattern is formed during manufacture of the mounting board 12, the wiring pattern can be formed by applying molybdenum, tungsten or the like to a green sheet as conductive material and baking the sheet. In that case, however, warpage of an alumina substrate may occur due to a difference in area ratio between metallization patterns formed on respective faces of the alumina substrate.

Therefore, in a case that such a problem can occur, the mounting board 12 is constituted without forming the annular electrode 14 in order to make ratios of metallization patterns on the both sides of the mounting board 12 approximately equal to each other. After the SAW chip 11 is mounted on the mounting board 12 in flip chip manner, a metal film is formed from an upper face side of the SAW chip 11 by vapor deposition, sputtering process or the like, and the annular electrode 14 is formed utilizing the metal film so that warpage of the mounting board 12 can be prevented.

Figure 9:
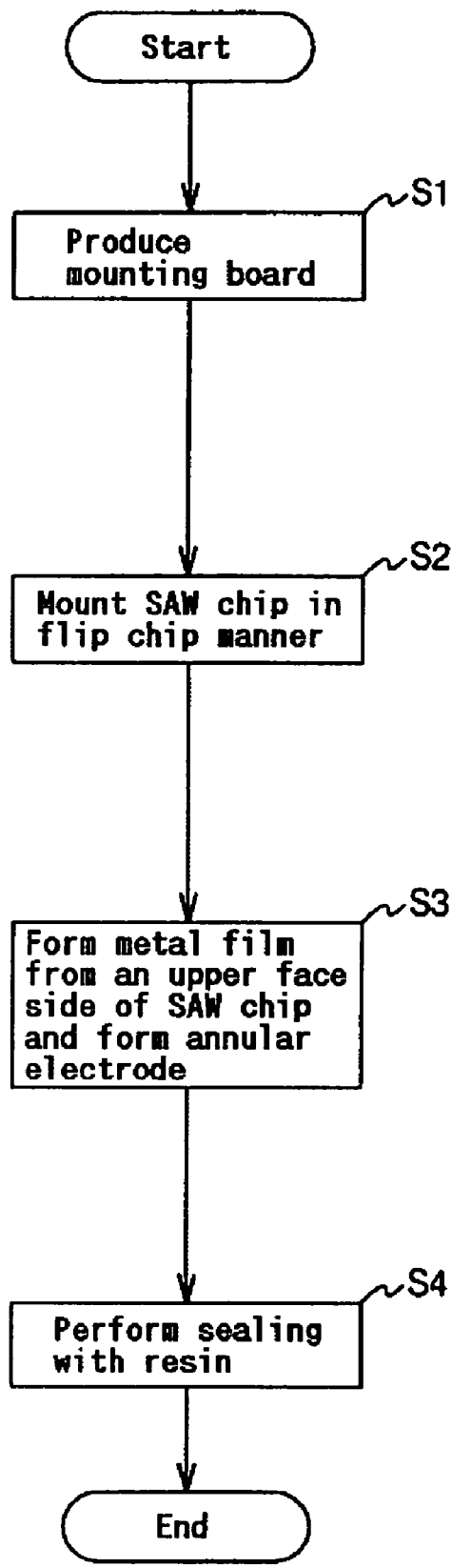
FIG. 9 shows a procedure of a method for manufacturing an SAW device.
Figure 9:
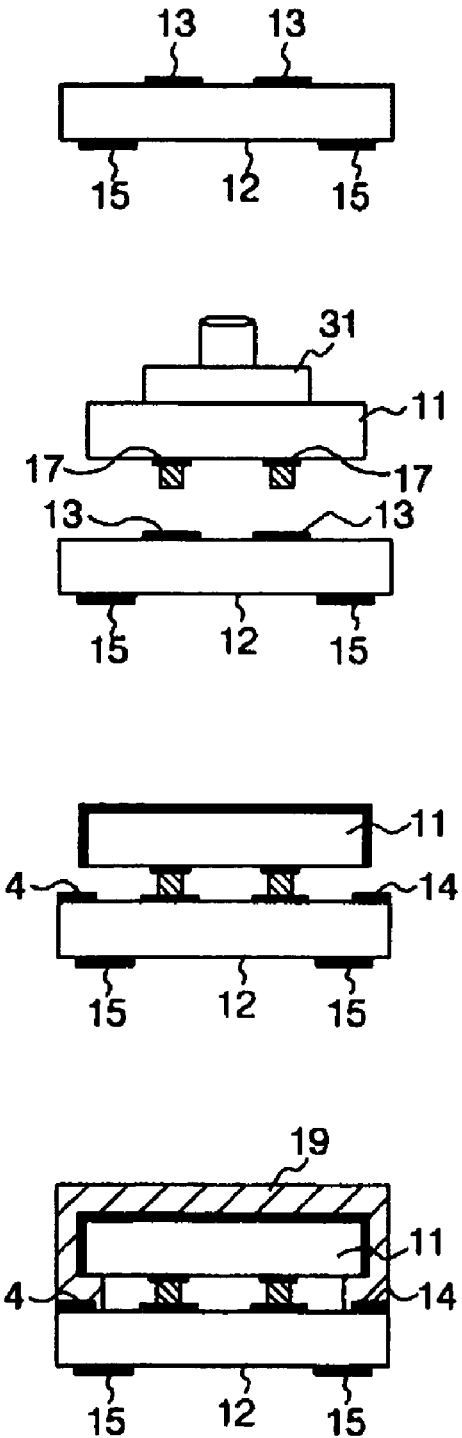

FIG. 9 shows a procedure in a method for manufacturing such a SAW chip.

In this case, first, in step S1 shown in FIG. 9, a mounting board 12 is manufactured in a manufacturing step for an alumina board (not shown).

Next, in step S2, a surface of a SAW chip 11 is put in a downwardly directed (face down) state utilizing, for example, a sucking tool 31 which can suck the SAW chip 11 and the SAW chip 11 is mounted on connection electrodes 13 of the mounting board 12 in a flip chip manner.

In step S3 subsequent thereto, metal such as aluminum (Al) is formed from an upper face of the SAW chip 11 by vapor deposition, sputtering process or the like in a state that the SAW chip 11 has been mounted on the mounting board 12 in a flip chip manner. Thereby, an annular electrode 14 is formed on the mounting board 12.

Thereafter, in step S4, a SAW device can be constituted by sealing the SAW chip 11 on the mounting board 12 with, for example, epoxy-base resin.

In this embodiment, the case that a SAW device is constituted by using a SAW chip obtained by packaging two filters has been explained as an example, but this case is merely one example and it is possible to constitute an SAW device using a SAW chip obtained by packaging for example, three or more filters, of course.

While there has been explained about the first and the second SAW filters of the embodiment where the input terminal is the unbalanced signal terminal and the output terminal is the balanced signal terminal, the present invention can be also applied to SAW filters where an input terminal is a balanced signal terminal and an output terminal is unbalanced signal terminal, of course.

According to the SAW device according to the present invention, in a constitution that a SAW chip where one set of terminals are constituted as balanced signal terminals and another set of terminals are constituted as unbalanced signal terminals is mounted to the mounting board in a flip chip manner and the mounting board and a surface of the SAW chip are covered with a resin layer, by connecting grounds of the plurality of SAW filters at least provided on the SAW chip together and providing an electrode (metallization) with a desired constitution grounded at such a position as to surround a signal pattern of the SAW chip on the mounting board, attenuation characteristics outside a passing band can be prevented from deteriorating. Thereby, additionally, since a lid member for shielding and a package frame for supporting the lid member which are conventionally required are made unnecessary, further downsizing can be realized.

The flexibility of the wiring at the mounting board side is improved by connecting grounds of the plurality of SAW filters together on the mounting board, so that improvement of electrical characteristics based upon a wiring design for the mounting board and further downsizing can be realized.

Furthermore, by forming the annular electrode so as to surround the signal pattern of the SAW chip formed on the mounting board on which the SAW chip is mounted and connecting the annular electrode to a grounding pattern, attenuation characteristics outside the passing band can be securely prevented from deteriorating.

Furthermore, the electrodes of the Saw chip and the connection electrodes on the mounting face of the mounting board connected via the bumps are separated to respective SAW filters by the grounding pattern. Thereby, since electromagnetic interference between the SAW filters can be reduced, a SAW device with an excellent isolation characteristic can be realized.

In addition, by forming metal films on an upper face and side faces of the SAW chip, a resin member is prevented from being charged. Furthermore, by forming metal films on a portion of the mounting board, since a gap between the mounting board and a connecting face of the SAW chip can be reduced at a portion where the metal film has been formed by a size of a thickness of the metal film, there is also such a merit that the resin layer can be suppressed from entering between the mounting board and the SAW chip 11 so that degradation of performance due to the inflow or the like can be prevented.

Furthermore, according to the method for manufacturing a SAW device, after a SAW chip is mounted on a mounting board in a flip chip manner, a metal film is formed from an upper face side of the SAW chip by vapor deposition, sputtering process or the like and the annular electrode is formed from the metal film, so that warpage or the like can be prevented from occurring in the mounting board.

What is claimed is:

1. A SAW broadband filter device comprising: a SAW chip including a plurality of SAW filters with different central frequencies formed on one piezoelectric substrate, ones of input and output terminals of said plurality of SAW filters being constituted as balanced signal terminals and the others thereof being constituted of unbalanced signal terminals; a mounting board on which said SAW chip is mounted on connection electrodes via conductive bumps in a flip chip manner; and a resin layer which is formed so as to cover the mounting board and a surface of the SAW chip, wherein respective grounds of said plurality of SAW filters are connected together to be connected to one grounding pattern of said mounting board; and at least one wiring pattern of one SAW filter of said plurality of SAW filters connected to said one grounding pattern on a mounting face of said mounting board and at least one wiring pattern of another SAW filter of said plurality of SAW filters connected to said one grounding pattern on the mounting face of the mounting board are connected to each other on said SAW chip; and wherein said one grounding pattern is provided on said mounting face of said mounting board so as to be at least between one connection electrode connected to an input or an output terminal of said one SAW filter of said plurality of SAW filters and another connection electrode connected to an input or an output terminal of said another SAW filter of said plurality of SAW filters;

said one connection electrode and said another connection electrodes are electrically separated; and of said conductive bumps, all of such conductive bumps that are connected to ground terminals are provided on said one grounding pattern.

2. The SAW device according to claim 1, wherein an annular electrode is formed on a mounting face of said mounting board on which the SAW chip is mounted so as to surround a signal pattern of said SAW chip and said annular electrode is connected to a ground.

3. The SAW device according to claim 2, wherein said annular electrode is connected to the ground via an inner layer wiring of said mounting board or a pattern formed on the mounting face.

4. The SAW device according to claim 1, wherein metal films are formed on an upper face and side faces of said SAW chip and a portion of the mounting board.

5. The SAW device according to claim 2, wherein said annular electrode is formed of a metal film.

6. A method for manufacturing a SAW broadband filter device comprising: a step of mounting a SAW chip including a plurality of SAW filters with different central frequencies formed on one piezoelectric substrate, ones of input and output terminals of said plurality of SAW filters being constituted as balanced signal terminals and the others thereof being constituted as unbalanced signal terminals, on connection electrodes of a mounting board via conductive bumps in a flip chip manner; and a step of, after mounting said SAW chip on said mounting board, forming an annular electrode on said mounting board by forming a metal film.

* * * * *